United States Patent [19]

Botti et al.

[11] Patent Number: 4,879,526

[45] Date of Patent: Nov. 7, 1989

[54] INTEGRATED AUDIO AMPLIFIER ELECTRONICALLY COMMUTABLE FROM A SINGLE ENDED OR STEREO CONFIGURATION TO A BALANCED OR BRIDGE CONFIGURATION AND VICEVERSA

[75] Inventors: Edoardo Botti, Mortara; Aldo Torazzina, Monza, both of Italy

[73] Assignee: SGS-Thomson Microelectronics, s.r.l., Italy

[21] Appl. No.: 246,111

[22] Filed: Sep. 19, 1988

[30] Foreign Application Priority Data

Sep. 30, 1987 [IT] Italy ............................... 83659 A/87

[51] Int. Cl.[4] .............................................. H03F 3/68
[52] U.S. Cl. ..................................... 330/295; 330/307
[58] Field of Search ...................... 330/84, 124 R, 146, 330/147, 148, 252, 258, 295, 307

[56] References Cited

U.S. PATENT DOCUMENTS

| | | | |
|---|---|---|---|
| 4,496,911 | 1/1985 | Lenz | 330/297 |
| 4,539,529 | 9/1985 | Lenz | 330/295 |
| 4,791,381 | 12/1988 | Lenz | 330/295 X |

Primary Examiner—Steven Mottola
Attorney, Agent, or Firm—Pollock, Vande Sande & Priddy

[57] ABSTRACT

A monolithically integrated audio amplifier which is commutable from a stereo configuration to a bridge configuration and vice versa may have only seven pins, namely: two output pins, two input pins, an supply pin, a ground pin and a SVR pin. It comprises two operational amplifiers which may both have two distinct input differential stages, a first input differential stage being fedback according to a stereo configuration while the other input differential stage being fedback according to a bridge configuration of the two operational amplifiers. A comparator with an internally fixed threshold determines, in function of its output state, the switching on or the switching off of one or the other of said two distinct input differential stages of the two operational amplifiers and, therefore, either a stereo configuration or a bridge configuration of the audio amplifier. The input terminal of the comparator may be connected to an input pin or to the SVR pin of the amplifier and a biasing DC voltage level may be imposed thereto through external biasing means for selecting the desired configuration.

8 Claims, 7 Drawing Sheets

INTEGRATED AUDIO AMPLIFIER ELECTRONICALLY COMMUTABLE FROM A SINGLE ENDED OR STEREO CONFIGURATION TO A BALANCED OR BRIDGE CONFIGURATION AND VICEVERSA

BACKGROUND OF THE INVENTION

1. Field of the Invention

The present invention relates to monolithically integrated audio amplifiers.

2. Description of the Prior Art

An ever increasing output power is requested from battery operated integrated audio amplifiers (car radios, portable radios and tape players, etc.). This has made popular integrated amplifiers capable of operating in a bridge configuration and, therefore theoretically capable of delivering to a loudspeaker of the sound reproduction system a peak voltage equal to twice the supply (battery) voltage. On the other hand, in case of somewhat lesser quality appliances, a single-ended configuration having an output dynamic equal to the supply voltage is still widely used. Such a configuration offers a reduced power dissipation and requires a lesser number of single amplification stages.

For obvious reasons, manufacturers of such appliances favor the use of integrated circuits requiring as few as possible external components and, on the other hand, having a small size package.

Also for easily comprehensible reasons and to minimize inventories, manufacturers of these apparatuses welcome the possibility of stocking a single integrated device capable of being connected to an external circuit and to operate correctly in a bridge configuration as well as in a single-ended or stereo configuration.

There are at present few commercially available integrated devices capable of permitting the connection in a bridge or in a stereo configuration of two amplifiers integrated monolithically on a single chip. These known devices utilize a rather cumbersome package having a large number of pins which permit, through the connection to an external circuit, obtaining either a bridge configuration or a stereo configuration of the two integrated amplifiers. Of course, integrated devices in small size, seven pin packages are available for either a bridge application or a stereo application, but not for both.

SUMMARY OF THE INVENTION

An object of the present invention is to provide an integrated audio amplifier, formed by a pair of amplifiers, which is capable of taking a bridge configuration or a single-ended stereo configuration (briefly referred to as stereo) and contained in a small size package having only seven pins.

This objective is achieved by the integrated audio amplifier of the present invention, which, though being manufactured in a seven pin package, allows selection of either a bridge or a stereo configuration of the two amplifiers (operational amplifiers) contained therein by simply modifying the level of the voltage applied as a continuous bias voltage to one of the pins of the device.

DESCRIPTION OF THE PREFERRED EMBODIMENTS

Figure 1:
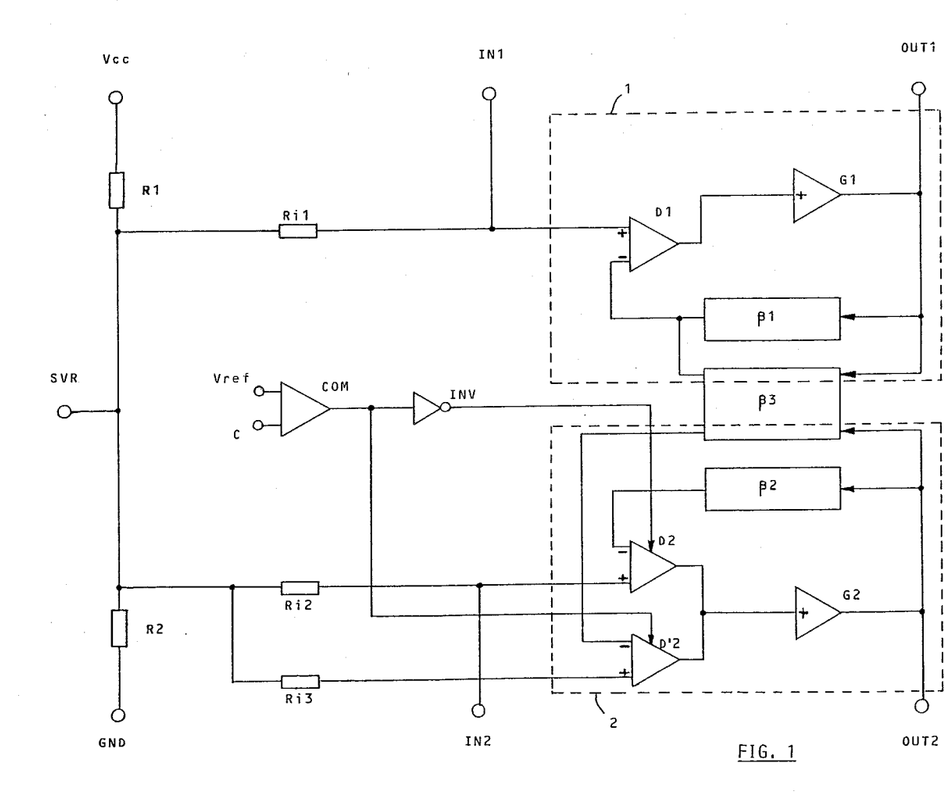
FIG. 1 is a basic block diagram of the integrated audio amplifier of the invention.
Figure 2:
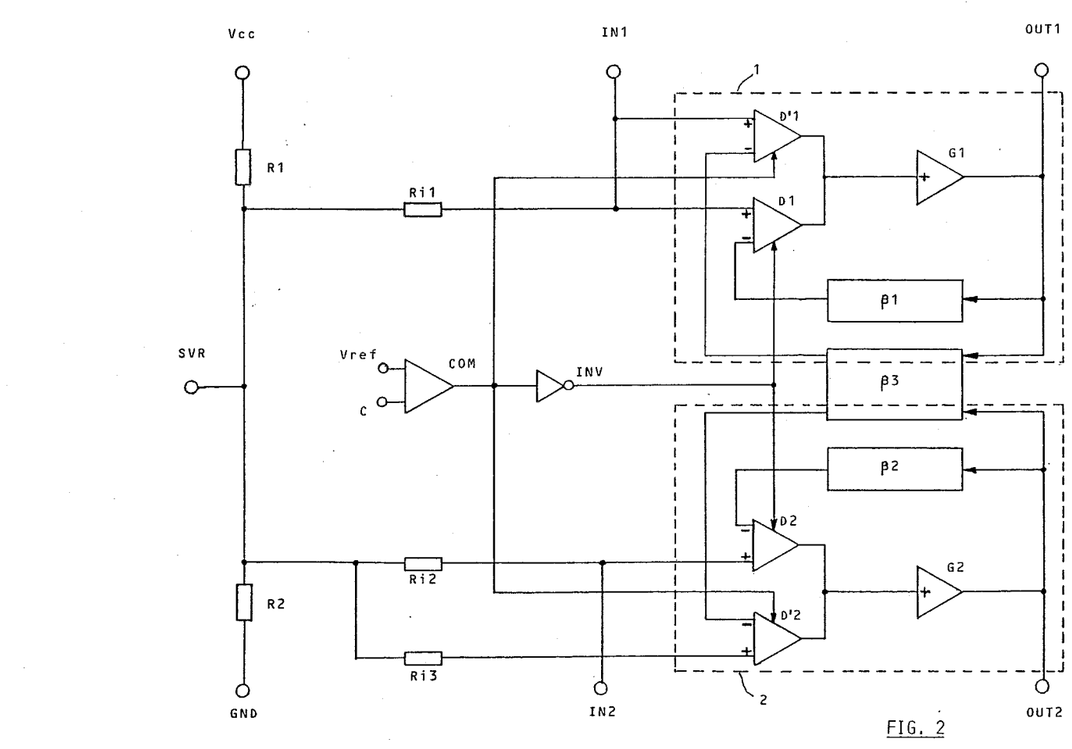
FIG. 2 is a basic block diagram of an integrated audio amplifier of the invention according to an alternative embodiment different from the embodiment shown in FIG. 1.

As shown in FIGS. 1 and 2, an audio amplifier of the invention comprises essentially two operational amplifiers 1 and 2, each comprising an output gain stage, respectively G1 and G2, the output terminals of which are connected respectively to the two pins OUT1 and OUT2 of the device. The gain stage (G1 and G2) of each operational amplifier is driven by a differential input stage.

At least one of the two operational amplifiers (the operational amplifier 2 in most of the block diagrams shown in the series of figures) is provided with two distinct, first and second input differential stages D2 and D'2. The other of the two operational amplifiers (the operational amplifier 1 in most of the diagrams shown in the figures) may be provided with a single input differential stage D1 (as shown in FIG. 1), or, according to an alternative embodiment of the invention, also this first operational amplifier 1 is, similarly to the second, provided with two distinct input differential stages D1 and D'1 (as shown in FIG. 2).

Moreover the audio amplifier is provided with three distinct feedback resistor networks, respectively $\beta 1$, $\beta 2$ and $\beta 3$. The feedback resistor network 1 is connected between the output of the gain stage G1 of the first operational amplifier and the inverting input of the single (FIG. 1) or of the first (D1) of the two distinct input differential stages D1 and D'1 (FIG. 2) of said first operational amplifier 1.

The feedback resistor network $\beta 2$ is connected between the output of the gain stage G2 of the second operational amplifier 2 and the inverting input of the first of said two distinct input differential stages (D2).

The two feedback resistor networks $\beta 1$ and $\beta 2$ are designed, as will be described in more detail further on in the description, to provide for the operation of the two operational amplifiers 1 and 2 in a single-ended stereo or simply in a stereo configuration, as will be shown later on.

The third feedback resistor network $\beta 3$ has a terminal connected to the inverting input of the second (D'2) of said two distinct inut differential stages of the second operational amplifier 2 and another terminal connected to the inverting input of the single input differential stage D1 of the first operational amplifier 1 (FIG. 1), or of the second (D'1) of said two distinct input differential stages contemplated also for the first operational amplifier 1 in the alternative embodiment shown in FIG. 2.

Said third feedback resistor network β3 is designed to provide for the connection of the two operational amplifiers in a bridge configuration, as will be described later on.

The integrated device of the invention further comprises a comparator circuit COM, having a threshold which is internally fixed by means of a constant reference voltage source $V_{REF}$ and a control input terminal C, an inverter INV, the input of which is connected to the output terminal of the comparator COM, and customary connections, eventually through appropriate resistances as shown, to the remaining pins of the device, i.e. to the signal input pins IN1 and IN2, to a supply pin VCC, to a ground pin GND and to an SVR pin, dedicated to the common mode rejection function, as shown in FIGS. 1 and 2.

The electronic switching of the integrated audio amplifier from a stereo configuration to a bridge configuration and vice versa is effected by biasing the input control terminal C of the comparator COM with a voltage which is lower or higher than the threshold voltage of the comparator VREF which is internally preset by appropriate means. The output of the comparator COM is connected to at least a control terminal for the switching on and off of at least said second (D'2) of said two distinct input differential stages of the second operational amplifier 2, while the output of the inverter INV is connected to at least a control terminal for the switching on and off of at least said first (D2) of said two distinct input differential stages of the second operational amplifier 2 (FIG. 1).

Alternatively, in the case of the embodiment shown in FIG. 2, the output of the comparator COM is connected also to at least a control terminal for the switching on and off of the second (D'1) of said two distinct input differential stages of the first operational amplifier 1 and the output of the inverter INV is connected also to at least a control terminal for the switching on and off of the first (D1) of said two distinct input differential stages of the first operational amplifier 1 (FIG. 2).

It is possible, therefore, by varying the voltage applied to the control terminal C of the integrated comparator to "select" one or the other of the two distinct input differential stages of one (2) or of both (1 and 2) the operational amplifiers. Of course the selection of one or of the other of said two distinct input differential stages implies a selection of the feedback resistor networks β1 and β2, in one case, or of the third feedback resistor network β3, in the other case.

An appropriate application of the audio signals t be amplified across the two input pins IN1 and IN2 and ground, respectively, in the case of a stereo configuration, or across the input pin IN1 and ground in the case of a bridge configuration, completes the predisposition of the integrated audio amplifier to the operation in one or the other configuration.

The control terminals for the switching on and off of the distinct input differential stages D1, D'1, D2 and D'2, may be conveniently represented by the gate terminal or base terminal of a transistor forming one of the biasing current generators of the differential input pair of transistors of the respective input differential stage, according to a common technique well known to the skilled technician. Depending upon the state of the output of the comparator COM, as well as of the output of the inverter INV, which is determined for both said output terminals by the voltage applied to the control terminal C of the comparator for selecting one or the other of said two possible configurations of the integrated audio amplifier, the level of voltage present at said output terminals of the comparator and of the inverter is such as to turn off or on the relative transistor of the biasing current generator or generators of the various distinct input differential stages, thus determining the switching off or switching on of one or of the other of the two distinct input stages of one and eventually also of the other of the two operational amplifiers 1 and 2.

Figure 3:
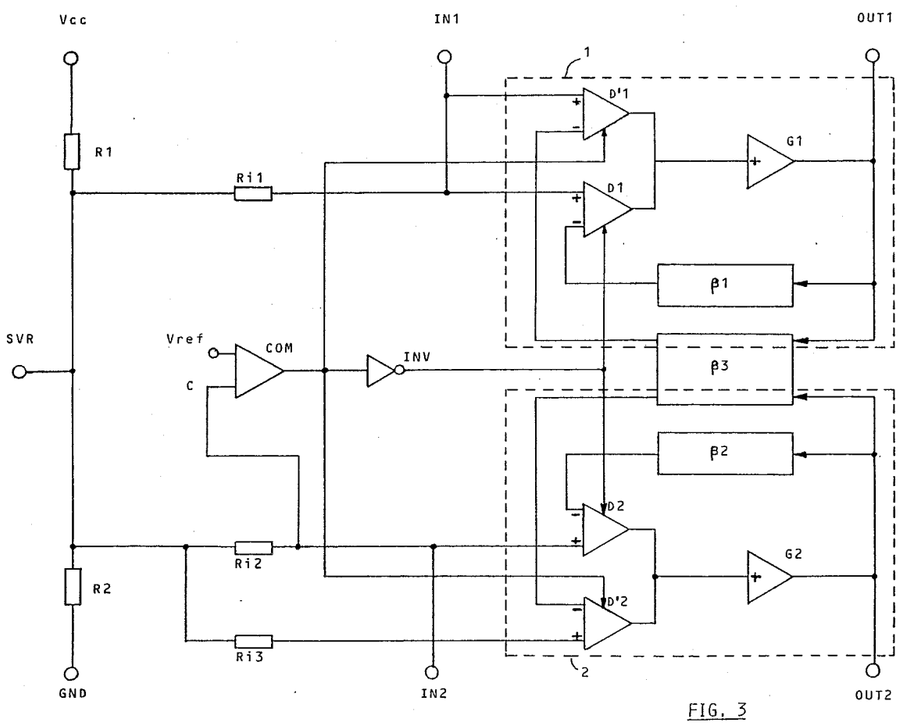
FIG. 3 is a block diagram of the amplifier of FIG. 2, according to a first form of embodiment thereof.
Figure 4:
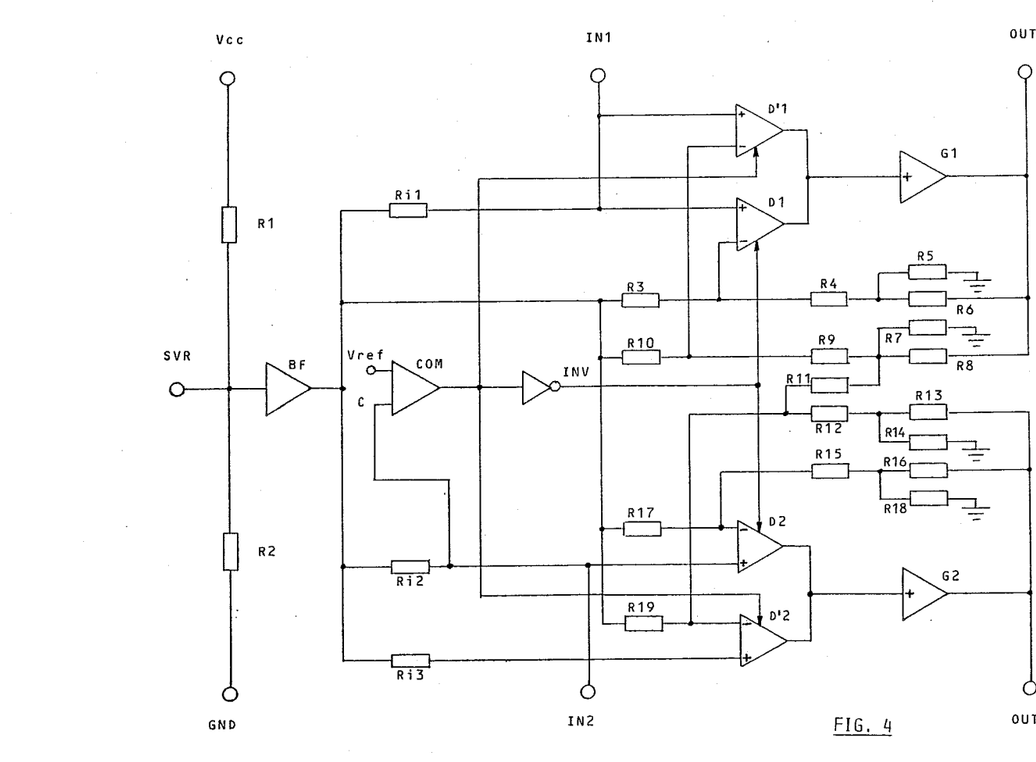
FIG. 4 is a more detailed block diagram of the amplifier described in FIG. 3.

The way to impose a determined voltage level to the control terminal C of the integrated comparator COM may vary. According to a first embodiment, the switching of the audio amplifier from a configuration to the order may be effected by sensing the DC voltage of the IN2 pin (which in the case of a desired connection of the audio amplifier in a bridge configuration would remain unused) which may be purposely biased to a value greater than the internal reference voltage $V_{REF}$. This first embodiment is practiced as shown in FIG. 3, relatively to the basic diagram of FIG. 2, by internally connecting the control terminal C of the comparator COM to the IN2 pin of the device. According to this first embodiment of the commutable integrated audio amplifier of the invention, a more detailed diagram is shown in FIG. 4.

The integrated voltage divider formed by R1 and R2 sets the DC voltage of the SVR (i.e. Supply Voltage Rejection) in for DC biasing the outputs OUT1 and OUT2 of the two operational amplifiers 1 and 2, respectively. The unitary gain buffer stage BF provides for decoupling the SVR pin from the DC biasing node of the non-inverting inputs of the input differential stages of the two operational amplifiers 1 and 2, which is effected through the respective input resistors Ri1, Ri2 and Ri3.

When the integrated audio amplifier is to be used in a stereo (single-ended) configuration, the audio signals to be amplified are applied to the input pins IN1 and IN2 and the IN2 pin will be internally biased to a DC input biasing voltage $V_{inDC}$ by means of the resistor Ri2.

When the integrated audio amplifier is to be used in a bridge configuration, the pin IN2 may be connected externally to the supply voltage Vcc.

Therefore, the comparator COM compares the voltage of the IN2 pin with a constant reference voltage $V_{REF}$ which is generated internally of the integrated device and the value of which is preset between said two limiting levels of voltage which may be taken by said IN2 pin. I.e. the reference voltage $V_{REF}$ will be set at a value such as to satisfy the following relation:

$$V_{inDC} < V_{REF} < Vcc$$

Figure 5A:
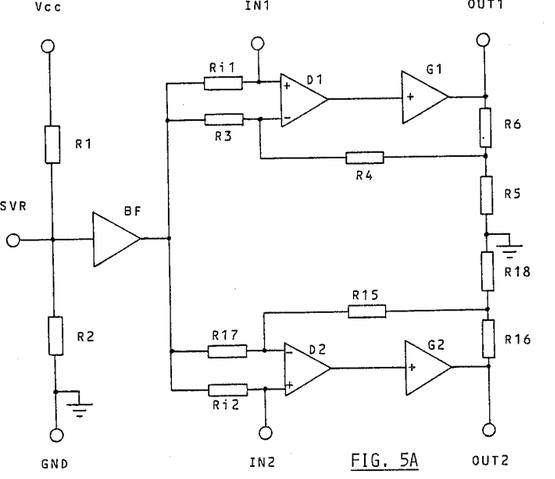
FIG. 5A is a functional block diagram of the amplifier of FIG. 4, when commuted in a stereo configuration.

Therefore, when a stereo configuration is desired, the voltage of the IN2 pin which is equal to $V_{inDC}$, determines the selection of the state of the comparator which turns on the input differential stages D1 and D2 and turns off the input differential stages D'1 and D'2, thus determining an internal circuit diagram as the one shown in FIG. 5A.

Figure 5B:
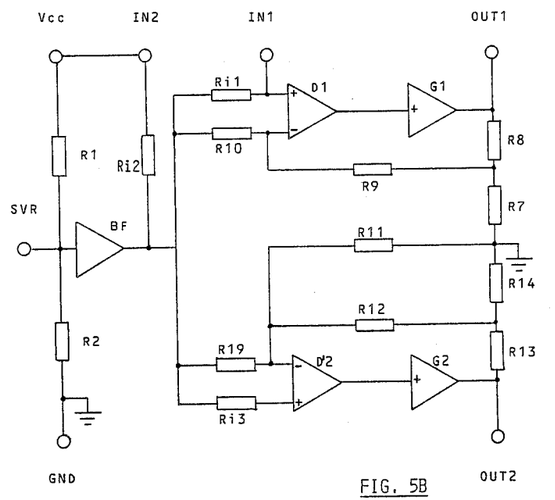
FIG. 5B is a functional block diagram of the amplifier of FIG. 4, when commuted in a bridge configuration.

When selecting the bridge configuration, the voltage of the IN2 pin will be equal to Vcc and this determines a state of the comparator opposite to the preceding state and thus the input differential stages D1 and D2 will be turned off while the input differential stages D'1 and D'2 will be turned on, thus determining an internal circuit diagram as shown in FIG. 5B.

The three distinct feedback resistors networks β1, β2 and β3 are respectively formed by the resistors R3, R4, R5 and R6, (β1);
R17, R15, R18 and R16, (β2); and
R10, R9, R7, R8, R11, R12, R13, R14 and R19, (β3).

As shown in FIGS. 5A and 5B, the feedback networks which are obtained in the two different configurations are networks of known type. In the case of a stereo (single-ended) configuration, shown in FIG. 5A, the DC gain is notably depending from the values of the resistors R5, R6, R16 and R18, while the AC gain is determined by the values of the resistors R3, R4, R5, R6 and R15, R16, R17 and R18 for the two respective operational amplifiers 1 and 2 connected in a stereo configuration.

In the case of a bridge configuration shown in FIG. 5B, the DC gain of the two operational amplifiers is determined by the values of the resistors R7, R8 and 13, R14, while the AC gain is determined by the values of the resistors R7, R8, R9, R10, R11, R12, R13 and R14.

As may be observed, the feedback resistor networks of the two integrated operational amplifiers, in the two contemplated configurations (stereo and bridge), may conveniently be entirely independent one from the other, thus offering a great versatility of the integrated device for a precise definition of the desired gains of the two integrated operational amplifiers in the two different configurations in which they may be commuted.

Figure 6:
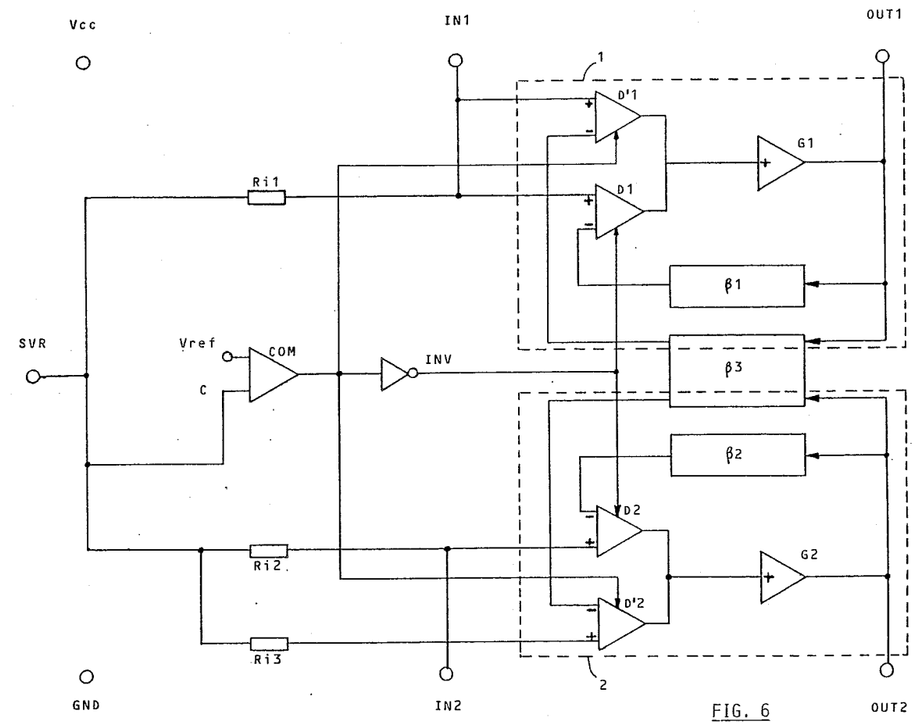
FIG. 6 is a block diagram of an amplifier of the type shown in FIG. 2, according to a different embodiment thereof.

According to a second embodiment of the integrated audio amplifier of the invention the control terminal C of the comparator COM is connected directly to the SVR pin of the device for determining the switching of the integrated audio amplifier from one configuration to the other as shown in the diagram of FIG. 6. According to this alternative embodiment, the state of the comparator COM and, therefore, the internal configuration of the integrated audio amplifier are determined by modifying by means of an external voltage divider the level of DC voltage applied to the SVR pin so that said biasing voltage level is higher or lower than a preset internally generated reference voltage $V_{REF}$. Of course, for a stereo configuration, the audio signals to be amplified will be applied to the two input pins IN1 and IN2 of the device, while for a bridge configuration the audio signal to be amplified will be applied to the IN1 pin, the IN2 pin remaining unused in this instance and being preferably connected to ground through a capacitor.

Also in the case of this alternative embodiment the selection of one or the other configuration will determine the selection of the relative feedback resistor networks β1, β2 and β3, which may have the same configuration already described above in relation to the diagrams of FIGS. 4, 5A and 5B.

Figure 7:
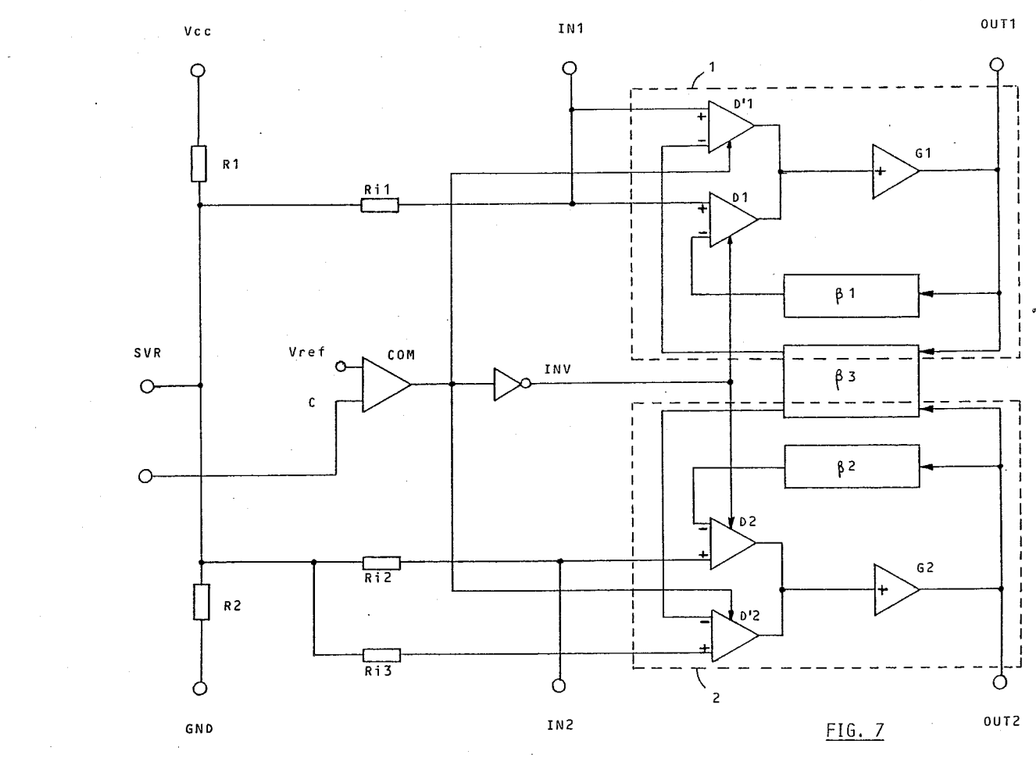
FIG. 7 is a block diagram of an amplifier of the type shown in FIG. 2, according to a further embodiment thereof.

According to a third alternative embodiment of the integrated audio amplifier of the invention, the selection of one or of the other of the two configurations which may be taken may also take place by individually biasing the control input terminal C of the comparator COM purposely connected to a separate (eighth) external pin of the integrated device. Of course this last embodiment requires a package with a number of pins greater than seven in order to have the availability of such a separate pin for directly biasing by external means the control terminal of the comparator. A block diagram of such an embodiment of the audio amplifier of the invention is shown in FIG. 7.

Although avoiding encumbering the disclosure with substantially repetitive diagrams the skilled technician will easily recognize that all three alternative embodiments of the way the selection between the two possible configurations of the two integrated operational amplifiers are also perfectly applicable to the embodiment depicted in the basic block diagram of FIG. 1, wherein the first of the two operational amplifiers is provided with only a single input differential stage D1 instead of two distinct input differential stages of the embodiment depicted in FIG. 2, which has been used for describing the three possible ways to implement the internal switching between the two configurations.

What we claim is:

1. An integrated audio amplifier which is commutable from a stereo configuration to a bridge configuration and vice versa, in a package having at least seven pins of which: two output pins, two input pins, a power supply pin, a ground pin and an SVR pin for a common mode signals rejection function, comprising a first and a second operational amplifier each being formed by an output gain stage whose output terminal is respectively connected to one of said two output pins of the integrated audio amplifier, and respectively, by at least a single and by at least two distinct, first and second input differential stages, the output terminals of which are respectively connected in common and to the input of the relative output gain stage;

two distinct feedback resistor networks for a stereo configuration connected, respectively, between the output terminal of an output gain stage and a respective inverting input terminal of at least said single and of at least the first of said two distinct input differential stages;

a third feedback resistor network for a bridge configuration connected between the output terminals of said two output gain stages and to an inverting input terminal of at least said single and of said second of said two distinct input differential stages;

a noninverting input of at least said single input differential stage and of said first of said two distinct input differential stages being connected, respectively, to one and to the other of said two input pins;

a noninverting input of said second of said two distinct input differential stages of said second operational amplifier being connected to a common potential node of the integrated audio amplifier;

a comparator having a transition threshold fixed by means of a constant reference voltage and having an input and an output terminal;

the output terminal of said comparator being connected to an on-off control terminal of at least said second of said two distinct input differential stages of said second operational amplifier and to an input terminal of an inverter stage having an output terminal which is connected to at least an on-off control terminal of at least said first of said two distinct input differential stages of said second operational amplifier;

the input terminal of said comparator being connected to a common potential node the voltage level of which is imposed by means external to the integrated audio amplifier;

said level of voltage imposed determining a state of the comparator and the switching on of one and the switching off of the other of said first and second distinct input differential stages of at least said second operational amplifier;

means for powering the integrated audio amplifier;

means for coupling an audio signal to be amplified to said input pins; and means capable of applying a DC voltage to said SVR pin having an intermediate value comprised between the voltage applied to said power supply pin and the voltage of said ground pin.

2. An integrated audio amplifier according to claim 1, wherein also said first operational amplifier is provided with at least two distinct first and second input differential stages, the output terminals of which are connected in common and to an input terminal of the relative output gain stage;

the respective feedback resistor network for stereo configuration being connected to an inverting input of said first input differential stage of said first operational amplifier;

said third feedback resistor network for bridge configuration being connected to an inverting input of said second input differential stage of said first operational amplifier;

a non-inverting input of said first and of said second input differential stage of said first operational amplifier being connected in common and at least to one of said input pins;

the output terminal of said comparator being connected further to an on-off control terminal of said second input differential stage of said first operational amplifier and the output terminal of said inverter being connected further to an on-off control terminal of said first input differential stage of said first operational amplifier.

3. An amplifier according to claim 1, wherein the input terminal of said comparator is connected to said SVR pin.

4. The amplifier according to claim 1, wherein the input terminal of said comparator is connected to one of said two input pins of the amplifier.

5. The amplifier according to claim 1, wherein the input terminal of said comparator is connected to an eighth pin of said integrated audio amplifier.

6. An amplifier according to claim 2, wherein the input terminal of said comparator is connected to said SVR pin.

7. The amplifier according to claim 2, wherein the input terminal of said comparator is connected to one of said two input pins of the amplifier.

8. The amplifier according to claim 2, wherein the input terminal of said comparator is connected to an eighth pin of said integrated audio amplifier.

* * * * *